(12) United States Patent
Li

(10) Patent No.: US 8,475,119 B2
(45) Date of Patent: Jul. 2, 2013

(54) AIRFLOW SHIELDING DEVICE AND COMPUTER SYSTEM EMPLOYING THE AIRFLOW SHIELDING DEVICE

(75) Inventor: Zhan-Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 665 days.

(21) Appl. No.: 12/759,835

(22) Filed: Apr. 14, 2010

(65) Prior Publication Data

US 2011/0141687 A1 Jun. 16, 2011

(30) Foreign Application Priority Data

Dec. 14, 2009 (CN) .............................. 200920317207

(51) Int. Cl.
*F04D 29/56* (2006.01)

(52) U.S. Cl.
USPC ........ 415/147; 415/146; 415/160; 415/213.1; 415/214.1; 454/154; 454/155; 454/184; 361/679.48; 361/694; 361/695

(58) Field of Classification Search
USPC .................. 415/146, 147, 148, 151, 159, 160, 415/213.1, 214.1; 361/679.48, 694, 695; 454/184, 154, 155
See application file for complete search history.

(56) References Cited

U.S. PATENT DOCUMENTS

| 2,034,587 | A  | * | 3/1936  | Maxwell ........................ 454/155 |
| 6,351,380 | B1 | * | 2/2002  | Curlee et al. .................. 361/695 |
| 6,839,233 | B2 | * | 1/2005  | Cravens et al. ............... 361/695 |
| 7,304,843 | B2 | * | 12/2007 | Peng et al. ................ 361/679.48 |
| 7,699,692 | B2 | * | 4/2010  | Yin ................................ 454/184 |
| 2008/0151490 | A1 | * | 6/2008  | Fan et al. ...................... 361/687 |
| 2008/0310103 | A1 | * | 12/2008 | Della Fiora et al. .......... 454/184 |
| 2010/0003126 | A1 | * | 1/2010  | Wang ............................ 415/146 |

* cited by examiner

Primary Examiner — Christopher Verdier
(74) Attorney, Agent, or Firm — Altis Law Group, Inc.

(57) ABSTRACT

An airflow shielding device is configured for being secured to fan and includes a first member, a second member, and a plurality of shielding pieces. The first member defines a first through opening. The second member defines a second through opening corresponding to the first through opening. The shielding pieces are rotatably secured between the first member and the second member and rotate between a closed position, where the shielding pieces cover the first through opening, and an open position, where the shielding pieces are located so that air can flow through the first and second through openings.

6 Claims, 6 Drawing Sheets

AIRFLOW SHIELDING DEVICE AND COMPUTER SYSTEM EMPLOYING THE AIRFLOW SHIELDING DEVICE

BACKGROUND

1. Technical Field

The present disclosure relates to an airflow shielding device and a computer system employing the airflow shielding device.

2. Description of Related Art

Commonly, a plurality of fans are used to dissipate heat in a computer system. However, if one or more of the fans are not operating, airflow can re-circulate through the airflow system and not dissipate heat properly.

BRIEF DESCRIPTION OF THE DRAWINGS

Many aspects of the embodiments can be better understood with references to the following drawings. The components in the drawings are not necessarily drawn to scale, the emphasis instead placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
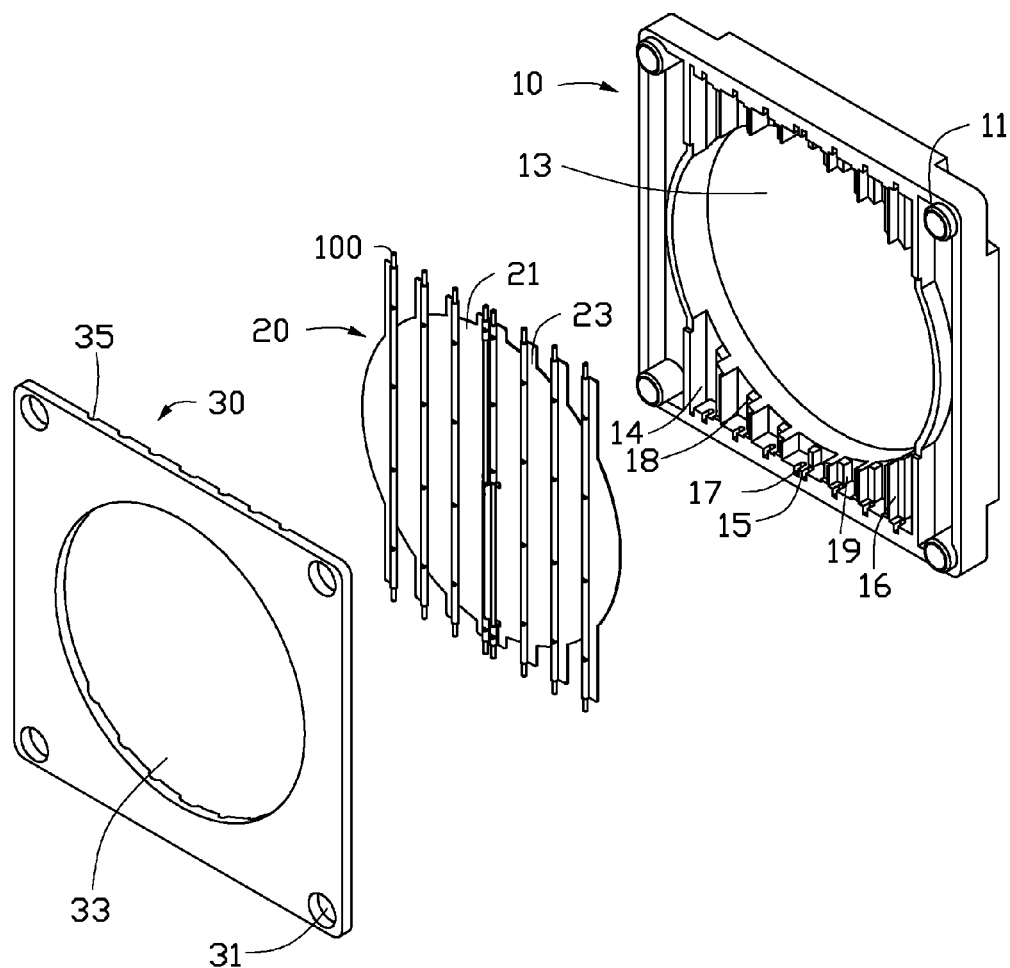
FIG. 1 is an exploded view of an airflow shielding device in accordance with an embodiment.

Referring to FIG. 1, an airflow shielding device in accordance with an embodiment includes a first member 10, a shielding member 20, and a second member 30.

The first member 10 defines a first through opening 13. A plurality of positioning posts 11 is located on the first member 10. In one embodiment, the first member 10 is rectangular and has four positioning posts 11 around the first through opening 13, and the first through opening 13 is circular. A plurality of first and second gaps 15 and 17 are defined in each of opposite sides of the first member 10. A plurality of first and second grooves 14 and 16 are defined in first member 10, and each of the first and second grooves 14 and 16 respectively correspond to each of the first and second gaps 15 and 17. First and second positioning blocks 18 and 19 are disposed in the first and second grooves 14 and 16. The first and second grooves 14 and 16 extend to communicate with the first through opening 13.

The second member 30 defines a second through opening 33. A plurality of positioning holes 31 are defined in the second member 30 to receive the first positioning posts 11. In an embodiment, the first member 10 is rectangular and has four positioning holes 31 around the second through opening 33. A plurality of holding slots 35 are defined in the second member 30, corresponding to the first and second gaps 15, 17.

Figure 2:
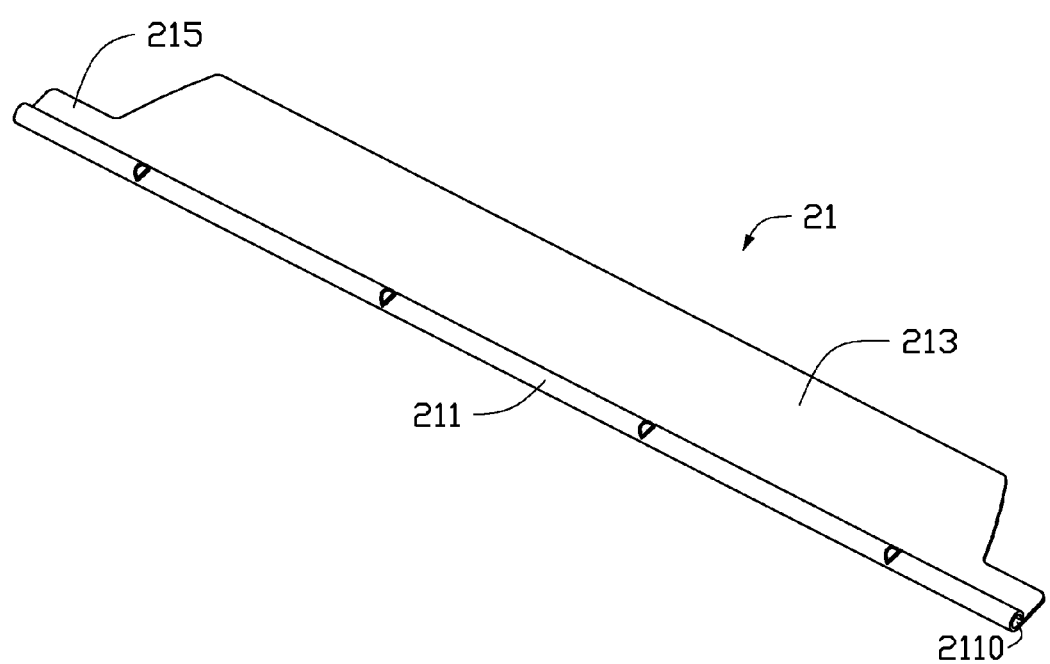
FIG. 2 is an isometric view of an embodiment of one shielding piece of the airflow shielding device of FIG. 1.

The shielding member 20 includes a plurality of first and second shielding pieces 21 and 23. The first and second shielding pieces 21 and 23 have structures in symmetry. FIG. 2 illustrates the structure of one first shielding piece 21 as an example. The first shielding piece 21 has a shaft sleeve 211 and a shielding portion 213 located on the shaft sleeve 211. The shaft sleeve 211 defines a pivot hole 2110 that receives a pivot shaft 100 (shown in FIG. 1). Two blocking portions 215 are disposed at two sides of the shielding portion 213. In one embodiment, the shielding portions 213 of the first and second shielding members 20 can together constitute a circular shape, to cover the first positioning openings 13 and 33 of the first and second members 10 and 30.

In assembly of the airflow shielding device, the pivot shafts 100 are inserted the pivot holes 2110 of the first shielding pieces 21 and then together with the first shielding pieces 21 placed in the first grooves 14. In an embodiment, the pivot shafts 100 are integral with the first pieces 21. Opposite ends of the pivot shafts 100 are inserted into the first gaps 15. The blocking portions 215 (shown in FIG. 2) of the first shielding pieces 21 are received in the first grooves 14. The second shielding pieces 23 are assembled to the first member 10 in the same means as the first shielding pieces 21. Then the second member 30 is placed on the first member 10, and the positioning posts 11 are inserted into the positioning holes 31. The holding slots 35 correspond to the first and second grooves 14 and 16. Therefore, the second member 30 is secured to the first member 10, and the shielding member 20 is secured between the first member 10 and the second member 30.

Each of the first and second shielding pieces 21 and 23 can be rotated relative to the first and second members 10 and 30. The movement of the first and second shielding pieces 21 and 23 are very similar, and the first shielding pieces 21 are described as an example. The first shielding pieces 21 can be rotated between a closed position, where the first shielding portions 213 substantially cover the first and second through openings 13 and 33, and an open position, where the blocking portions 215 allow air through the first and second through openings 13 and 33.

Figure 3:
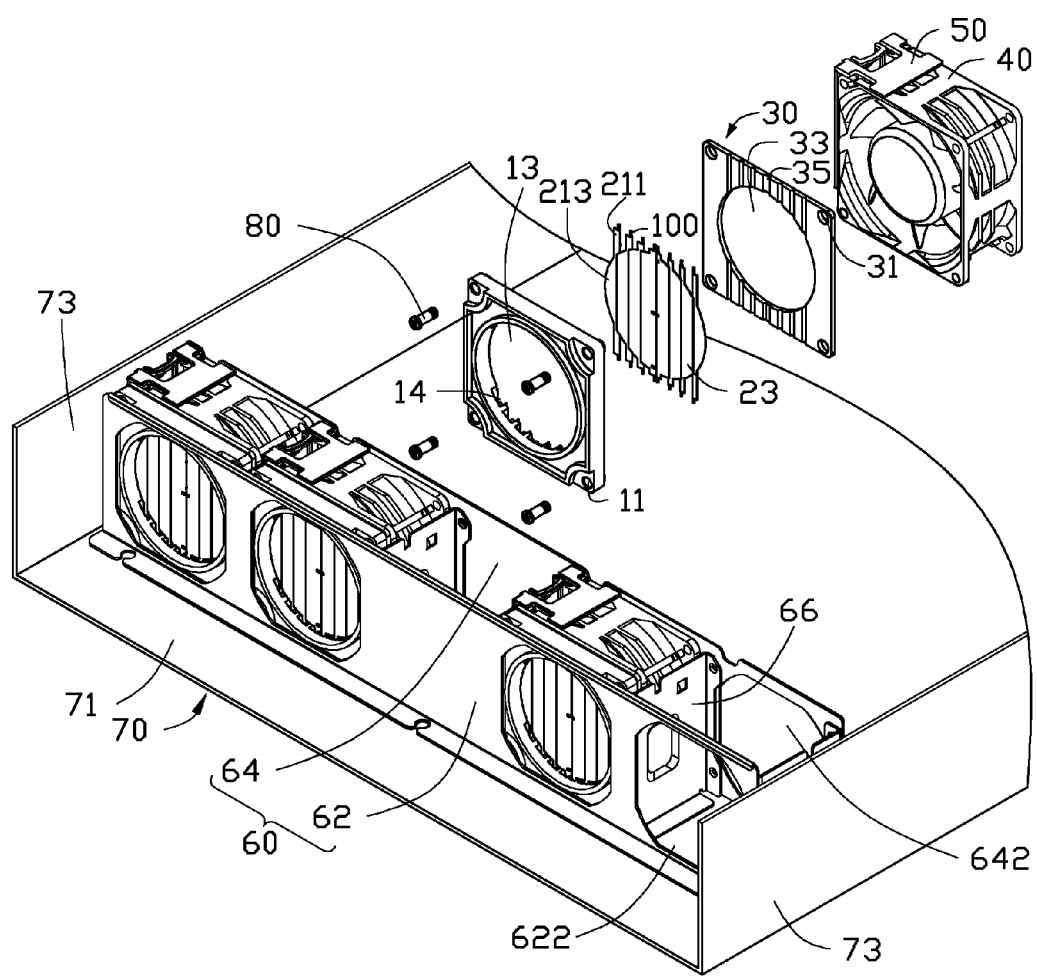
FIG. 3 is an exploded view of a computer system in accordance with an embodiment.

Referring to FIG. 3, an embodiment of the airflow shielding device can be attached to a fan 40. The fan 40 can be secured to a chassis 70 of a computer system by a locking member 50.

The chassis 70 includes a chassis bottom wall 71 and two opposite chassis sidewall 73 connected to the chassis bottom wall 71. A bracket 60 is secured to the chassis bottom wall 71 between the chassis sidewalls 73. The bracket 60 includes a first securing plate 62 and a second securing plate 64. In an embodiment, the first and second securing plate 62 and 64 are substantially parallel to each other. The first and second securing plate 62 and 64, define a plurality of ventilation holes 622 and 642. A plurality of isolation plates 66 are located on the first and second securing plates 62 and 64, and each isolation plate 66 is positioned each adjacent two ventilation holes 622 and 642. In an embodiment, the isolation plates 66 are substantially perpendicular to the first and second securing plates 62 and 64.

In assembling the fan 40 and the airflow shielding device to the chassis 70, the airflow shielding device is inserted into the bracket 60 between two adjacent isolation plates 66. The first member 10 is adjacent to or abuts on the first securing plate 62. Then the fan 40 together with the locking member 50 is inserted into the bracket 60 between the airflow shielding device and the second securing plate 64. The locking member 80 engages with one isolation plate 66 to secure the fan 40 in the bracket 60.

Figure 4:
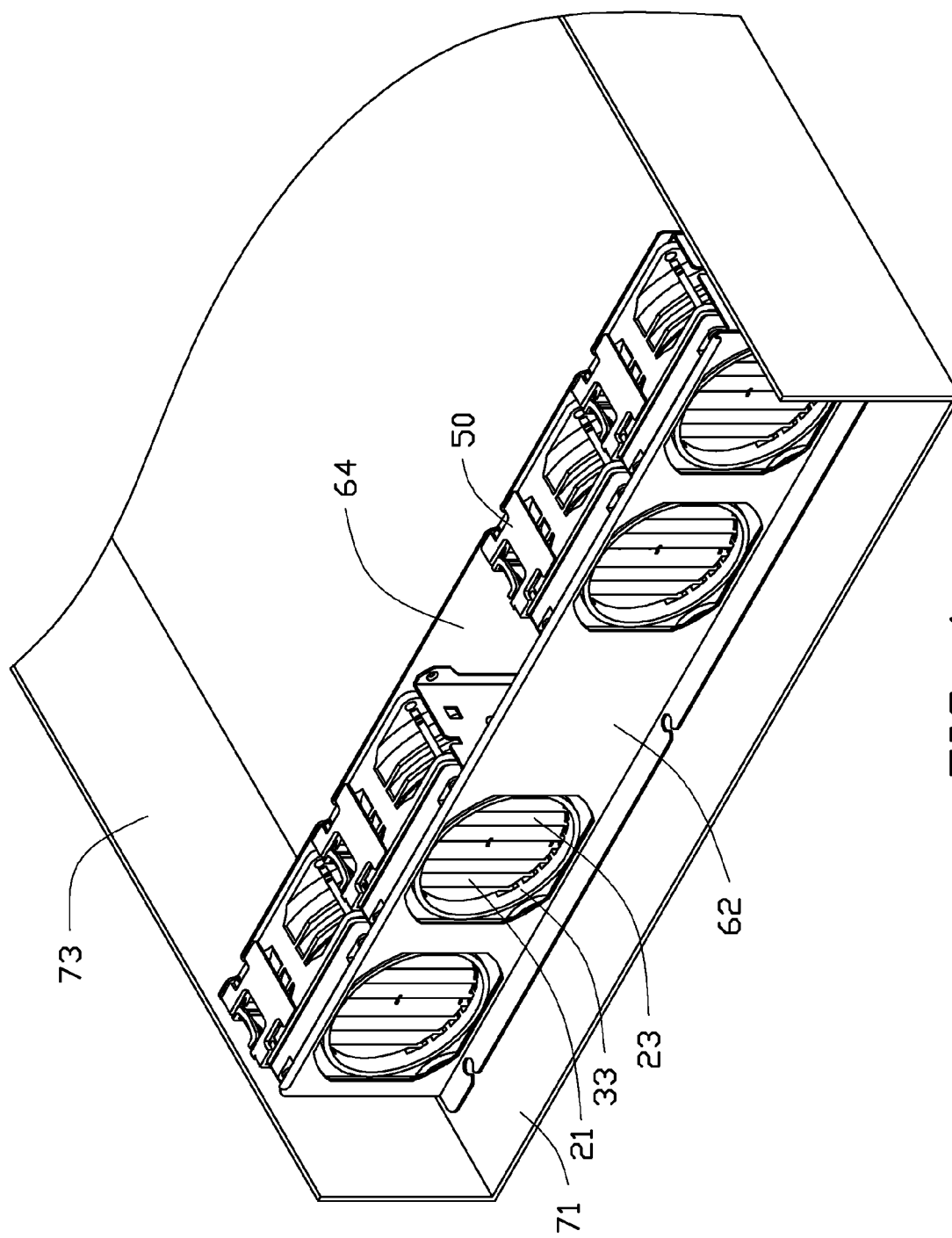
FIG. 4 is an assembled view of an embodiment of a computer system, showing shielding pieces in a closed position.

FIG. 4 illustrates an embodiment of the airflow shielding devices used in a computer system before the fans 40 are at work, and the first and second shielding pieces 21 and 23 are located in the closed position.

Figure 5:
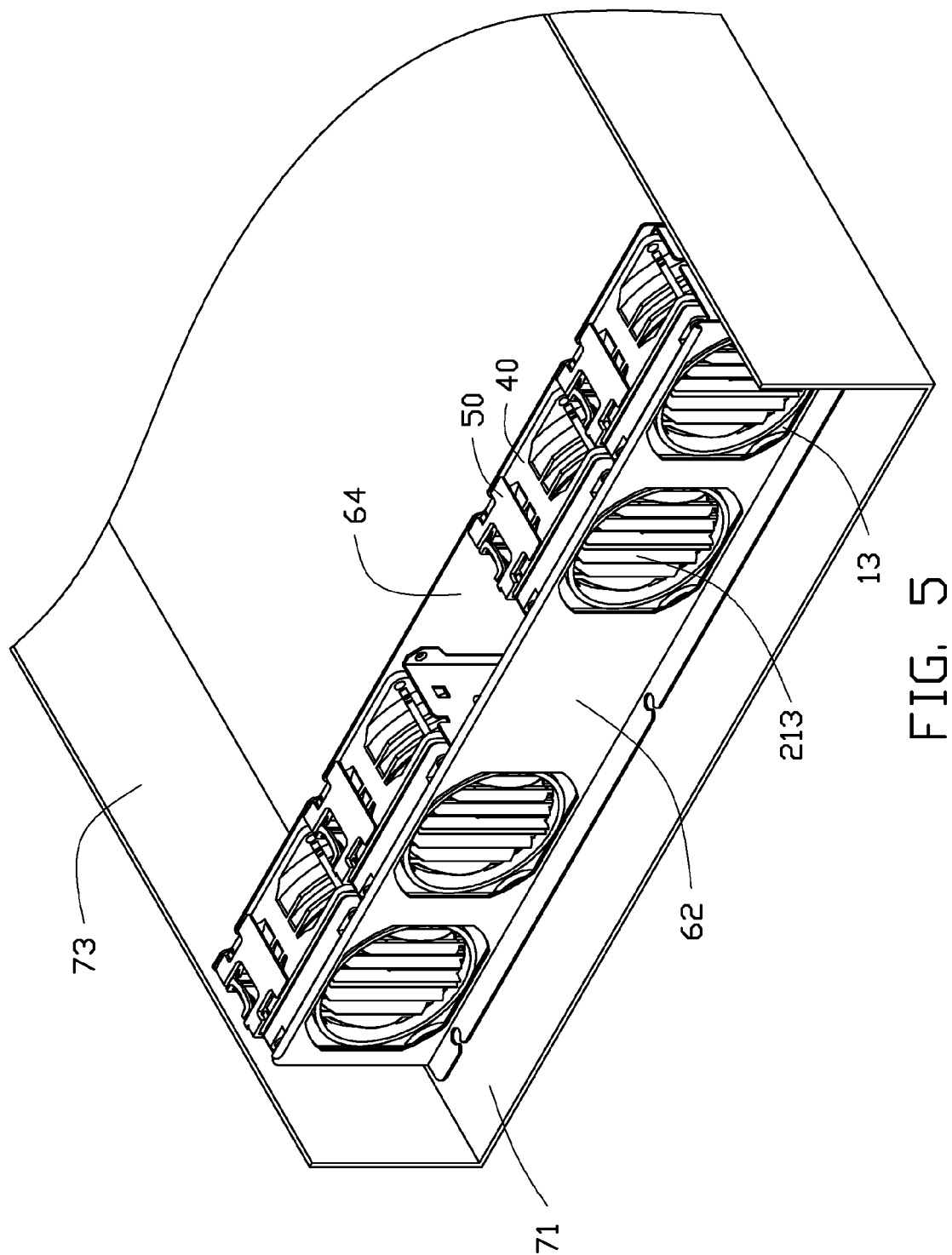
FIG. 5 is similar to FIG. 4, but showing the shielding pieces in an open position.

Referring to FIG. 5, when all fans 40 are at work, airflow flows from the fans 40 towards the airflow shielding device, to rotate the first and second shielding pieces 21, 23 to the open position. Therefore, the airflow can smoothly flow through the ventilation holes 642 of the second securing plate 64, the fans 40, the airflow shielding devices, and the ventilation holes 622 of the first securing plate 62.

Figure 6:
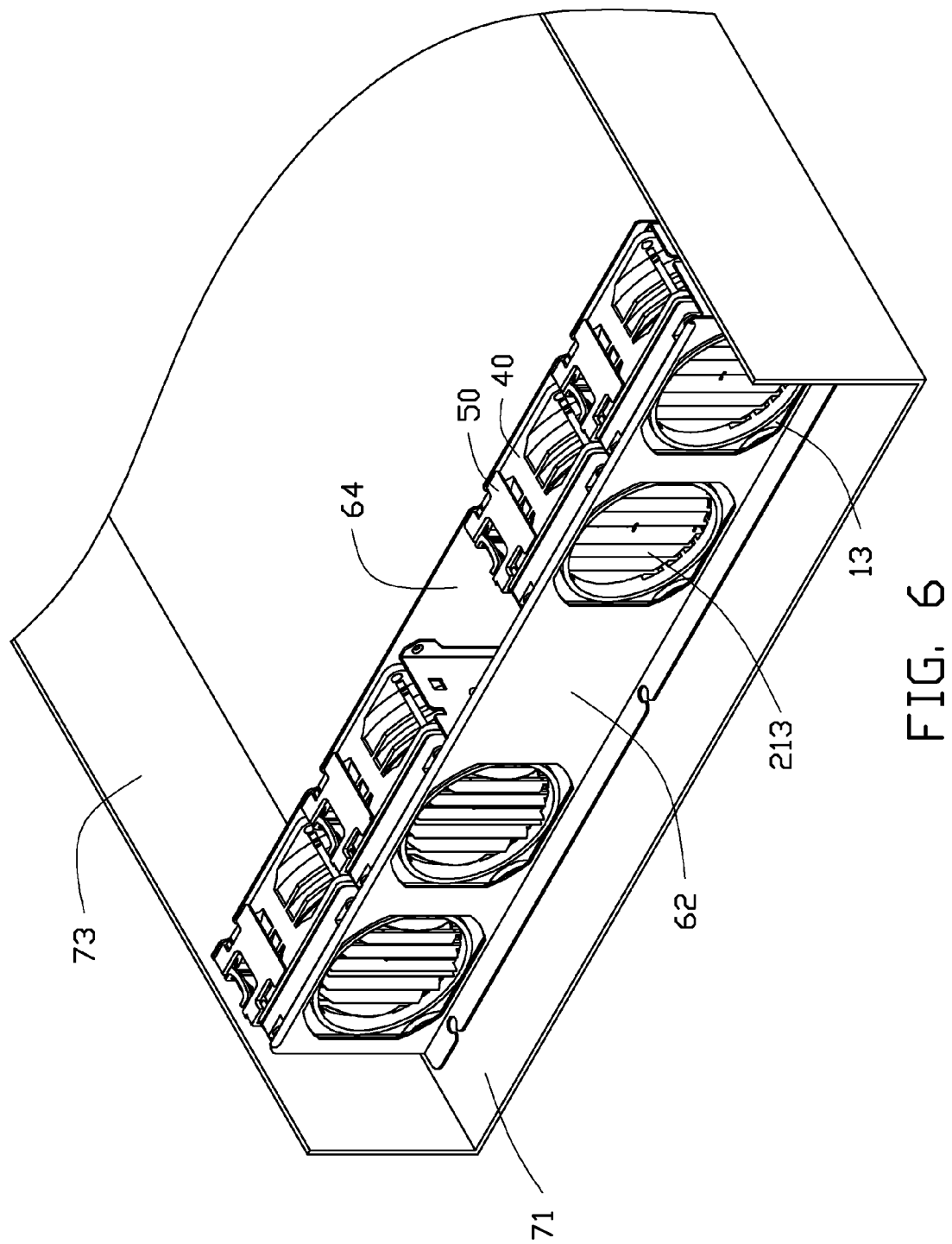
FIG. 6 is similar to FIG. 5, but showing the shielding pieces of two airflow shielding device of an embodiment of FIG. 1 in the closed position.

Referring to FIG. 6, when two fans 40, for example, are not operating, airflow flows back from the second through opening 33 to the first through opening 13, to rotate the first and second shielding pieces 21 and 23 to the closed position, so no airflow can flow back through the corresponding airflow guiding devices.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. An airflow shielding device configured for being secured to a fan, the airflow shielding device comprising:
   a first member defining a first through opening;
   a second member defining a second through opening corresponding to the first through opening; and
   a plurality of shielding pieces rotatably secured between the first member and the second member, the plurality of shielding pieces can rotate between a closed position, where the plurality of shielding pieces cover the first through opening, and an open position, where the plurality of shielding pieces are located so that air can flow through the first and second through openings;
   the first member defines a plurality of gaps; a shaft is disposed on each shielding piece; and the shafts are rotatably received in the plurality of gaps;
   the first member defines a plurality of grooves respectively adjacent to the plurality of gaps; each shielding piece comprises a blocking portion; and the blocking portions are rotated in the plurality of grooves when the plurality of shielding pieces are rotated between the open and closed positions; and
   a positioning block is located in each groove; and the blocking portions of the plurality of shielding pieces abut the positioning blocks when the plurality of shielding pieces are in the open position.

2. The airflow shielding device of claim 1, wherein the second member defines a plurality of holding slots corresponding to the plurality of grooves of the first member.

3. A computer system comprising:
   a fan;
   a first member defining a first through opening;
   a second member attached to the fan and engaging with the first member, the second member defining a second through opening corresponding to the first through opening; and
   a plurality of shielding pieces rotatably secured between the first member and the second member, the plurality of shielding pieces can be rotated between a closed position, where airflow is blocked by the plurality of shielding pieces from passing through the first and second through opening, and an open position, where airflow is directed from the fan to pass through the first and second through openings;
   the first member defines a plurality of gaps; a shaft is disposed on each shielding piece; and the shafts are rotatably received in the plurality of gaps;
   the first member defines a plurality of grooves respectively adjacent to the plurality of gaps; each shielding piece comprises a blocking portion; and the blocking portions are rotated in the plurality of grooves when the plurality of shielding pieces are rotated; and
   a positioning block is located in each groove; and the blocking portions of the plurality of shielding pieces abut the positioning blocks when the plurality of shielding pieces are in the open position.

4. The computer system of claim 3, wherein the second member defines a plurality of holding slots corresponding to the plurality of grooves of the first member.

5. The computer system of claim 3, further comprising a chassis, the chassis comprising a first and a second securing plate, and the fan, the first member, the plurality of shielding pieces and the second member are secured between the first and the second securing plate.

6. The computer system of claim 5, wherein the first securing plate defines a first ventilation hole; the second securing plate defines a second ventilation hole; and the first and second ventilation holes correspond to the first and second through opening.

* * * * *